(12) United States Patent
Liu et al.

(10) Patent No.: US 11,197,398 B2
(45) Date of Patent: Dec. 7, 2021

(54) INSTALLATION STRUCTURE AND INSTALLATION METHOD OF PLUG-IN SWITCH TUBE

(71) Applicant: SHENZHEN VMAX NEW ENERGY CO., LTD., Guangdong (CN)

(72) Inventors: Jun Liu, Guangdong (CN); Yingying Feng, Guangdong (CN); Shun Yao, Guangdong (CN)

(73) Assignee: SHENZHEN VMAX NEW ENERGY CO., LTD., Shenzhen (CN)

( * ) Notice: Subject to any disclaimer, the term of this patent is extended or adjusted under 35 U.S.C. 154(b) by 0 days.

(21) Appl. No.: 16/857,368

(22) Filed: Apr. 24, 2020

(65) Prior Publication Data

US 2020/0253094 A1 Aug. 6, 2020

Related U.S. Application Data

(63) Continuation of application No. PCT/CN2018/083858, filed on Apr. 20, 2018.

(30) Foreign Application Priority Data

Jan. 4, 2018 (CN) .......................... 201810007206.5

(51) Int. Cl.
*H05K 7/20* (2006.01)
*H01L 23/40* (2006.01)
(Continued)

(52) U.S. Cl.
CPC ..... *H05K 7/20927* (2013.01); *H05K 7/20872* (2013.01); *H01H 9/52* (2013.01);
(Continued)

(58) Field of Classification Search
CPC .......... H05K 7/20218; H05K 7/20927; H05K 7/20872; H05K 7/2049;
(Continued)

(56) References Cited

U.S. PATENT DOCUMENTS 6,326,761 B1 * 12/2001 Tareilus ................ H02M 7/003
318/722
9,147,634 B2 * 9/2015 Kodama ............... H01L 23/473
(Continued)

FOREIGN PATENT DOCUMENTS

CN       103429041 A     12/2013
CN       105702645 A      6/2016
(Continued)

OTHER PUBLICATIONS

State Intellectual Property Office of the P R. China (ISR/CN), "International Search Report for PCT/CN2018/083858", China, Aug. 7, 2018.

*Primary Examiner* — Zachary Pape
(74) *Attorney, Agent, or Firm* — Locke Lord LLP; Tim Tingkang Xia, Esq.

(57) ABSTRACT

An installation structure and an installation method of a plug-in switch tube is disclosed in the present invention, the installation structure comprises, a PCB board, a plug-in switch tube fixed on said PCB board, and a housing matching said PCB board and said plug-in switch tube, wherein the lower end surface of said housing is provided with a cooling liquid flow channel, and said plug-in switch tube is pressed against the side wall of the cooling liquid flow channel by an elastic pressing-piece. The installation structure according to the present invention has the advantages of small volume, excellent heat dissipation effect, simple assembly, low cost and light weight.

9 Claims, 4 Drawing Sheets

(51) Int. Cl.
  *H01L 23/473*   (2006.01)
  *H01H 9/52*    (2006.01)
  *H02J 7/00*    (2006.01)

(52) U.S. Cl.
  CPC ........ *H01L 23/4093* (2013.01); *H01L 23/473* (2013.01); *H02J 7/0042* (2013.01); *H05K 7/2049* (2013.01); *H05K 7/20254* (2013.01)

(58) Field of Classification Search
  CPC .. H05K 2201/10393; H01L 2023/4043; H01L 2023/405; H01L 2023/4062; H01L 2023/4081; H01L 2023/4087; H01L 23/473; H01H 9/52
  See application file for complete search history.

(56) References Cited

U.S. PATENT DOCUMENTS

| | | | |
|---|---|---|---|
| 9,295,185 B2* | 3/2016 | Icoz | H05K 7/20927 |
| 9,820,414 B2* | 11/2017 | You | H05K 7/20927 |
| 10,455,745 B2* | 10/2019 | Jang | H01L 23/4006 |
| 10,917,999 B2* | 2/2021 | Huang | H05K 5/0008 |
| 2008/0278918 A1 | 11/2008 | Tominaga et al. | |

FOREIGN PATENT DOCUMENTS

| | | | | |
|---|---|---|---|---|
| CN | 106572621 A | | 4/2017 | |
| CN | 206165082 U | | 5/2017 | |
| EP | 2114116 A1 | * | 11/2009 | ......... H01L 23/4093 |
| WO | 2017119753 A1 | | 7/2017 | |

\* cited by examiner

INSTALLATION STRUCTURE AND INSTALLATION METHOD OF PLUG-IN SWITCH TUBE

CROSS-REFERENCE TO RELATED PATENT APPLICATION

This application is a continuation application of International Patent Application No. PCT/CN2018/083858, filed on Apr. 20, 2018, which itself claims priority to Chinese Patent Application No. CN201810007206.5 filed in China on Jan. 4, 2018. The disclosures of the above applications are incorporated herein in their entireties by reference.

FIELD

The present invention relates to the field of charging technology and voltage conversion equipment of pure electric vehicles and hybrid vehicles, and particularly to an installation structure and an installation method of a plug-in switch tube.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

With the need for energy saving and emission reduction, and the need to control air pollution, new energy vehicles have gradually become popular in the market, and electric vehicles are the main force of new energy vehicles. Electric vehicles are divided into pure electric vehicles and hybrid vehicles, of which the on-board charger OBC and voltage converter DCDC are important components of electric vehicles. The on-board charger OBC, voltage converter DCDC, or related integrated products have problems of large dimensions, insufficient heat dissipation capacity, and difficult assembly.

SUMMARY

The object of the present invention is to overcome the deficiencies of the prior art, and provide an installation structure and an installation method of a plug-in switch tube.

In the technical solution adopted by the present invention, an installation structure of a plug-in switch tube is provided, the installation structure comprises, a PCB board, a plug-in switch tube fixed on said PCB board, and a housing matching said PCB board and said plug-in switch tube, wherein the lower end surface of said housing is provided with a cooling liquid flow channel, and said plug-in switch tube is pressed against the side wall of the cooling liquid flow channel by an elastic pressing-piece.

The upper end of said housing is open, and a fixed installation window is provided on the lower end surface to match said plug-in switch tube. A bottom plate is also provided on the lower end surface of said housing.

Preferably, an elastic pressing-piece mounting base for mounting the elastic pressing-piece is provided on the side wall of said cooling liquid flow channel.

Preferably, said elastic pressing-piece comprises a mounting portion that matches the elastic pressing piece mounting base, a vertical portion that is vertically arranged with the mounting base, and a clamping portion that is connected to the vertical portion and has an obtuse angle with the vertical portion.

Preferably, said cooling liquid flow channel comprises a water channel groove provided on the lower end surface of said housing, a cover plate matching said water channel groove, and a liquid inlet and a liquid outlet provided on said housing and connected with said water channel groove mouth.

Preferably, one end of the water channel groove has an oval structure.

The installation method of the installation structure of the plug-in switch tube according to the present invention comprises the following steps:

a) welding the cover plate to the channel groove,
b) fixing the plug-in switch tube on the PCB board,
c) fixing the PCB board to the housing,
d) mounting the elastic pressing-piece into the housing through the fixed installation window on the housing, and pressing the plug-in switch tube on the cooling liquid flow channel, and
e) mounting the cover plate on the fixed installation window, and filling the joint between the fixed installation window and the cover plate with a sealant.

The on-board charger OBC, voltage converter DCDC, or related integrated products have the advantages of small volume, excellent heat dissipation effect, simple assembly, low cost and light weight, by using the installation structure of the plug-in switch tube provided by the present invention.

DETAILED DESCRIPTION

The technical solutions of the present invention will be further described in detail below with reference to the figures and embodiments.

As shown in FIG. 1 to FIG. 4, the installation structure of the plug-in switch tube provided by the present invention includes:

the PCB board 10, the plug-in switch tube 20 fixed on the PCB board 10, and the housing 30 matching the PCB board and the plug-in switch tube. The upper end of the housing 30 is open, and the fixed installation window 31 is provided on the lower end surface to match the plug-in switch tube 20.

Specifically, the plug-in switch tube 20 is first welded to the PCB board 10, then the PCB board with the welded plug-in switch tube is inserted through the upper end of the housing 30, and the plug-in switch tube 20 corresponds to the fixed installation window 31. After finishing mounting, a sealant can be injected into the housing 30 to seal the fixed installation window.

Figure 1:
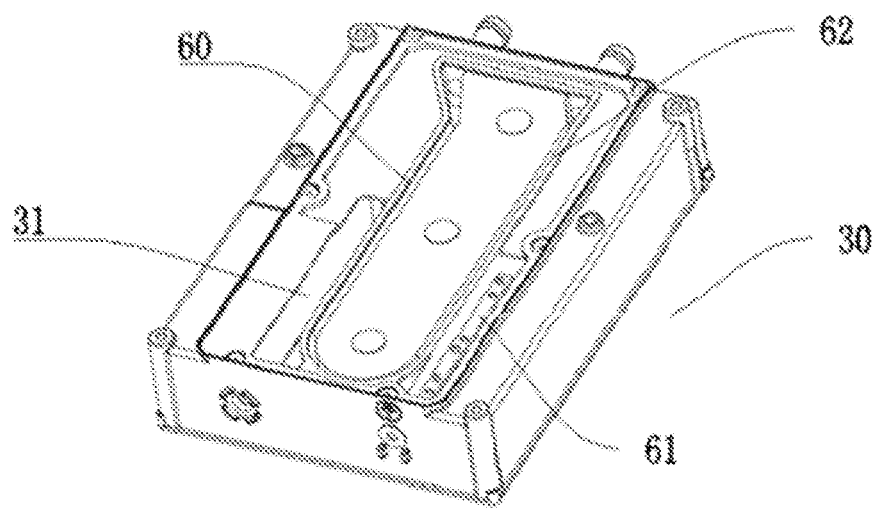
FIG. 1 is a structural schematic diagram of the housing in the installation structure of the plug-in switch tube of the present invention.
Figure 5:
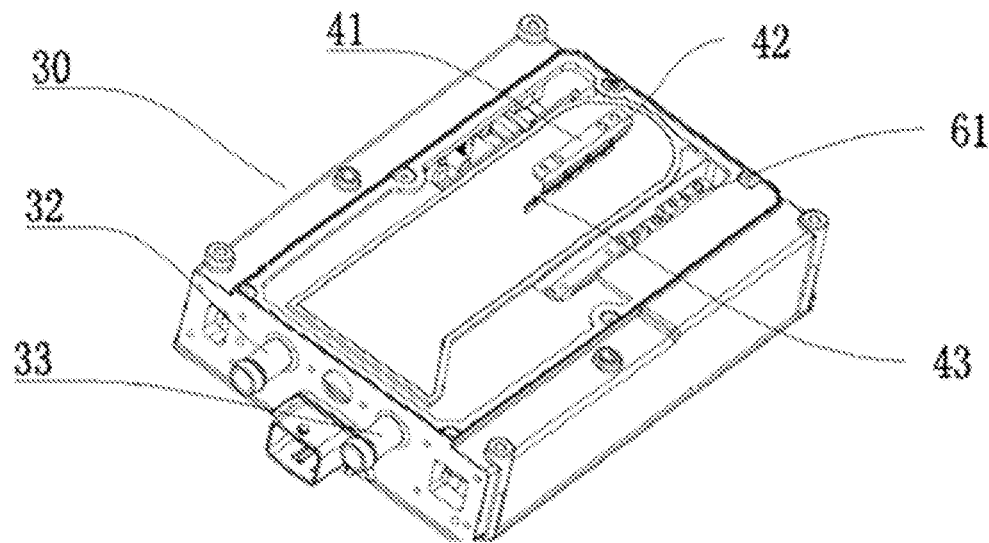
FIG. 5 is a structural schematic diagram of the housing in the installation structure of the plug-in switch tube of the present invention from another angle.
Figure 6:
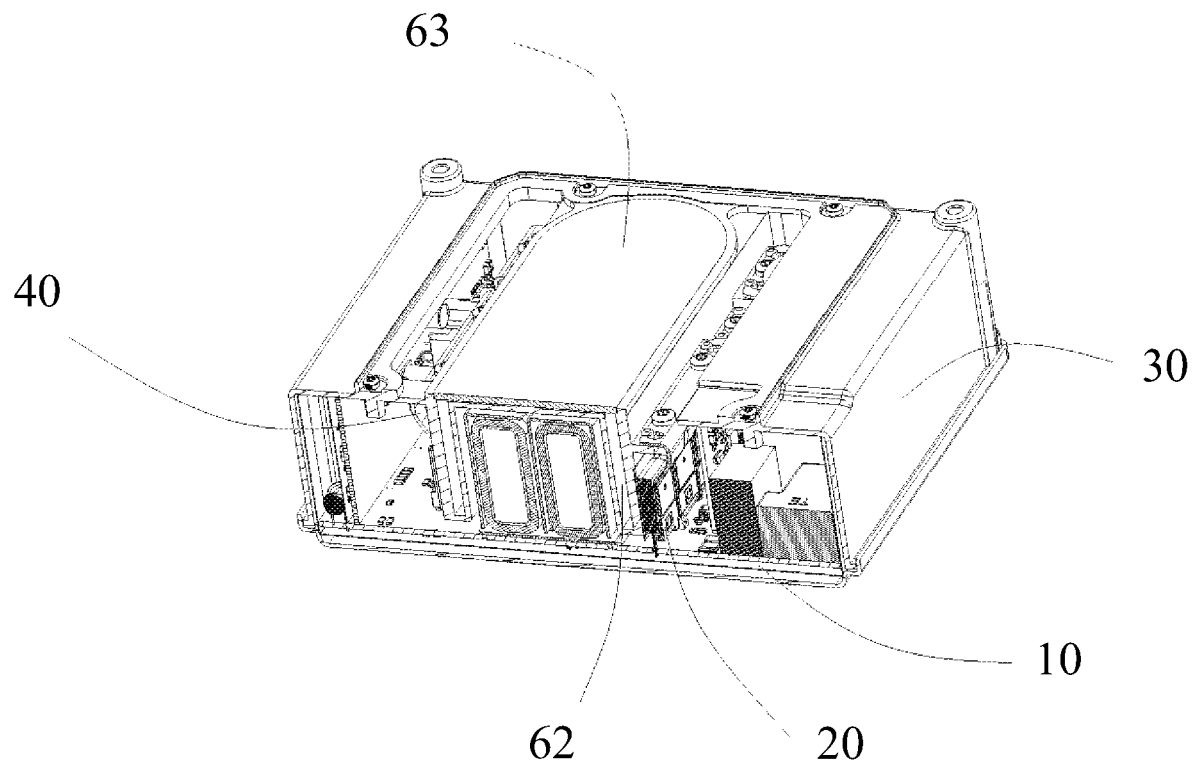
FIG. 6 is a transverse cross-sectional view after finishing mounting the elastic pressing-piece in the installation structure of the plug-in switch tube of the present invention.

As shown in FIG. 1 and FIG. 6, the lower end surface of the housing 30 is set with the cooling liquid flow channel 60 that extends into the housing. The installation structure further includes: the elastic pressing-piece 40 that is set on the housing 30 to press the plug-in switch tube 20 against the side wall of the cooling liquid flow channel 60 on the housing 30, as shown in FIG. 5 and FIG. 6.

In order to make the plug-in switch tube 20 fit with the cooling liquid flow channel 60, the elastic pressing-piece 40 is designed. With the elastic pressing-piece 40, the plug-in switch tube 20 is pressed against the side wall of the cooling liquid flow channel 60 to quickly dissipate heat generated by the plug-in switch tube through the cooling liquid flow channel.

The elastic pressing-piece mounting base 61 is set on the side wall of the cooling liquid flow channel 60 for mounting the elastic pressing-piece 40. The elastic pressing-piece 40 comprises the mounting portion 41 that matches the elastic pressing piece mounting base 61, the vertical portion 42 that is vertically arranged with the mounting base, and the clamping portion 43 that is connected to the vertical portion 42 and has an obtuse angle with the vertical portion 42.

Specifically, the mounting portion 41 and the elastic pressing-piece mounting base 61 are fixedly connected by screws. In a normal state, after the elastic pressing-piece 40 is mounted, it exactly fits to the side wall of the cooling liquid flow channel 60. However, as the plug-in switch tube 20 is inserted into the side wall of the cooling liquid flow channel 60, then the clamping portion 43 is in contact with the plug-in switch tube 20, and a pressure perpendicular to the side wall of the cooling fluid flow channel 60 is generated on the plug-in switch tube 20, so that the plug-in switch tube 20 is pressed against the cooling fluid flow channel 60.

When the plug-in switch tube 20 is in operation, the generated heat can be quickly taken away by the cooling fluid in the cooling fluid flow channel 60, which accelerates the heat dissipation of the plug-in switch tube 20.

Meanwhile, in order to better accelerate the heat conduction of the plug-in switch tube 20, a thermally conductive sheet made of a material with high thermal conductivity can be added between the plug-in switch tube 20 and the side wall of the cooling fluid flow channel between which the heat transfer is accelerated.

Figure 2:
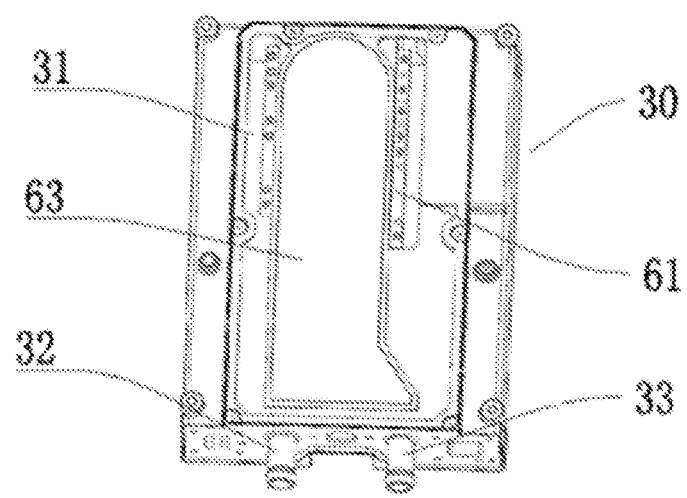
FIG. 2 is a structural schematic diagram for assembling the housing and the cover plate in the installation structure of the plug-in switch tube of the present invention.
Figure 3:
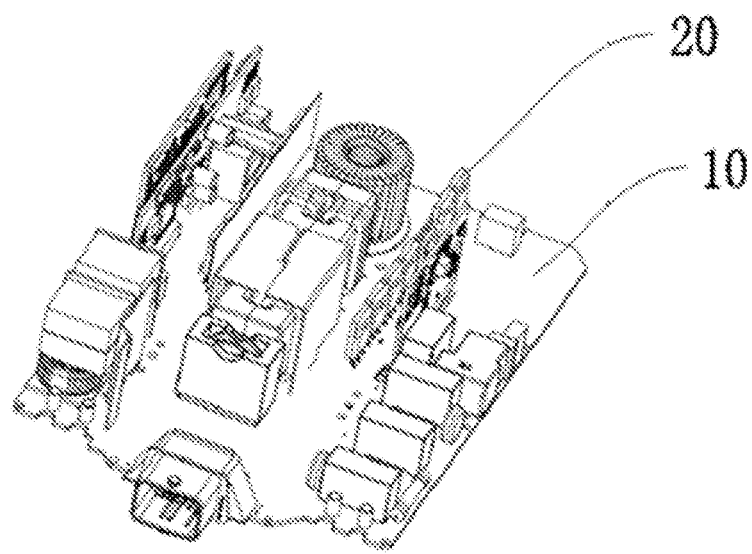
FIG. 3 is a structural schematic diagram for assembling the PCB board and the plug-in switch tube.
Figure 4:
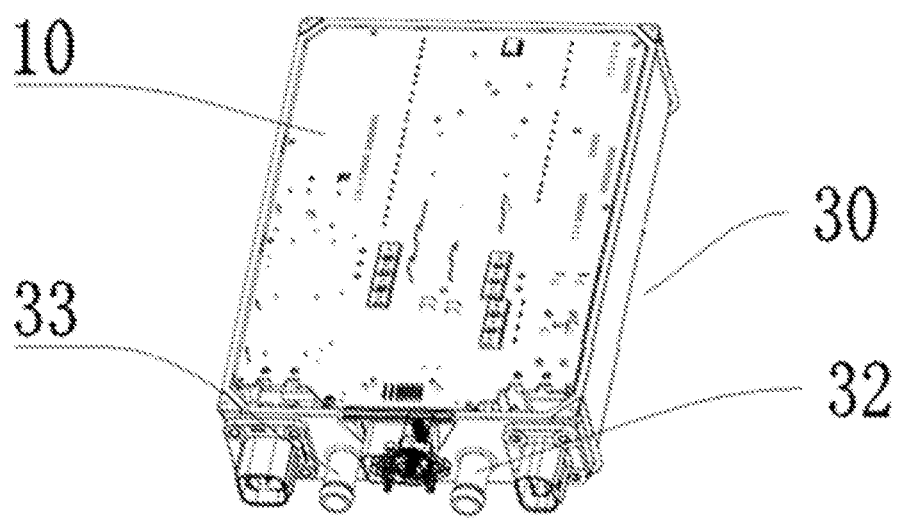
FIG. 4 is a schematic diagram after mounting the PCB board on the housing.

As shown in FIG. 2, the cooling liquid flow channel 60 comprises the water channel groove 62 extending from the lower end surface of the housing 30 to the inside of the housing, the cover plate 63 matching the water channel groove 62, and the liquid inlet 32 and the liquid outlet 33 that are set at one end of the housing 30 and connected with the water channel groove 62.

The water channel groove 62 is preferably oval, and is arranged around electronic components.

Figure 7:
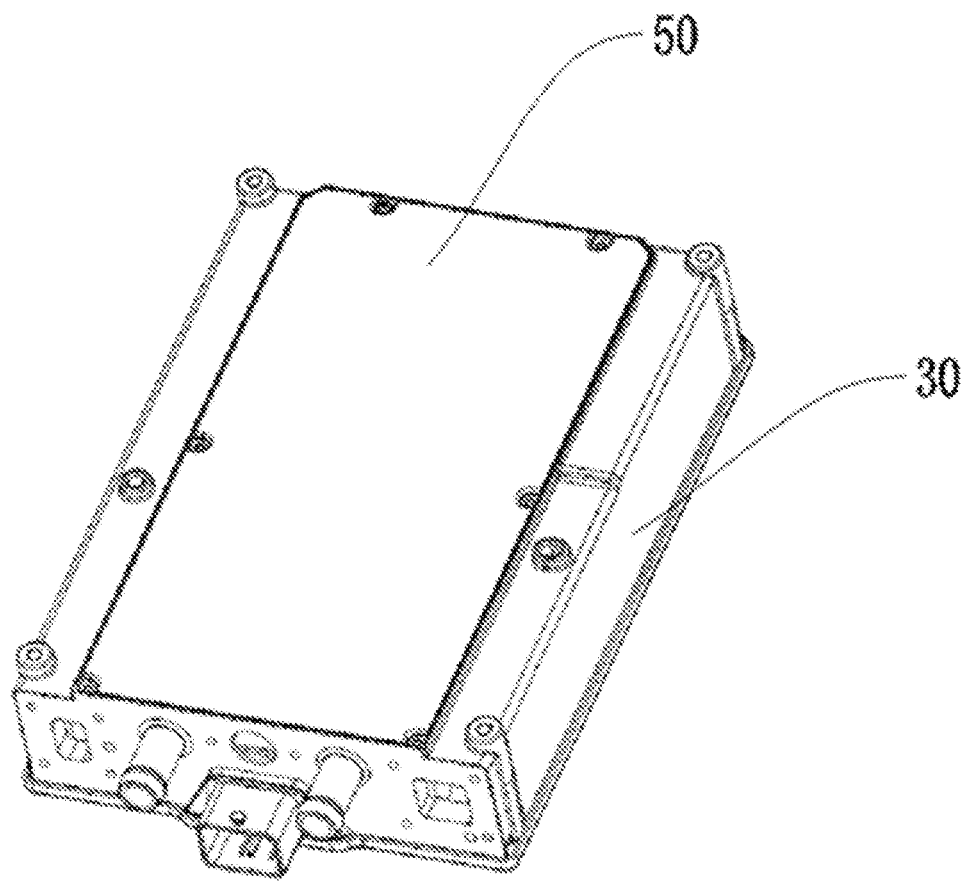
FIG. 7 is a structural schematic diagram after mounting the bottom plate on the housing of the plug-in switch tube of the present invention.

As shown in FIG. 7, the bottom plate 50 is further provided on the lower end surface of the housing 30.

The installation method of the installation structure of the plug-in switch tube according to the present invention comprises the following steps:
a) welding the cover plate 63 to the channel groove 62,
b) fixing the plug-in switch tube 20 on the PCB board 10,
c) fixing the PCB board 10 to the housing 10,
d) mounting the elastic pressing-piece 40 into the housing 30 through the fixed installation window 30 on the housing 30, and pressing the plug-in switch tube 20 on the cooling liquid flow channel 60, and
e) mounting the cover plate on the fixed installation window 31, and filling the joint between the fixed installation window and the cover plate with a sealant.

In summary, the installation structure of the plug-in switch tube according to the present invention has the advantages of small volume, excellent heat dissipation effect, simple assembly, low cost and light weight.

The above embodiments are only used to describe specific implementations of the present invention. It should be noted that, for those skilled in the art, without departing from the concept of the present invention, several deformations and changes can be made, and all of these deformations and changes should belong to the protection scope of the present invention.

What is claimed is:

1. An installation structure of a plug-in switch tube, comprising:
a PCB board,
a plug-in switch tube fixed on said PCB board, and
a housing matching said PCB board and said plug-in switch tube,
wherein an upper end of said housing is open, a fixed installation window is provided on a lower end surface of the housing to match said plug-in switch tube, the lower end surface of said housing is provided with a cooling liquid flow channel, said cooling liquid flow channel comprises a water channel groove extending from the lower end surface of the housing to an inside of the housing, an elastic pressing-piece is provided to be mounted into the housing through the fixed installation window, and said plug-in switch tube is pressed against a side wall of the cooling liquid flow channel by the elastic pressing-piece, and
wherein the plug-in switch tube is welded on the PCB board, and the PCB board and the plug-in switch tube welded thereon are inserted through the upper end of the housing, such that the PCB board covers the upper end of the housing, and the plug-in switch tube welded on the PCB board is located between the PCB board and the lower end surface of the housing.

2. The installation structure according to claim 1, wherein a bottom plate is also provided on the lower end surface of said housing.

3. The installation structure according to claim 1, wherein a mounting base for mounting the elastic pressing-piece is provided on the side wall of said cooling liquid flow channel.

4. The installation structure according to claim 3, wherein said elastic pressing-piece comprises a mounting portion that matches the mounting base, a vertical portion that is vertically arranged with the mounting base, and a clamping portion that is connected to the vertical portion and has an obtuse angle with the vertical portion.

5. The installation structure according to claim 1, wherein said cooling liquid flow channel further comprises a cover plate matching said water channel groove, and a liquid inlet and a liquid outlet provided on said housing and connected with said water channel groove.

6. The installation structure according to claim 5, wherein one end of said water channel groove has an oval structure.

7. An installation method of a plug-in switch tube, wherein the installation method comprises the following steps:

providing a PCB board, the plug-in switch tube, and a housing to match said PCB board and said plug-in switch tube, wherein an upper end of said housing is open, a fixed installation window is provided on a lower end surface of the housing to match said plug-in switch tube, the lower end surface of said housing is provided with a cooling liquid flow channel, said cooling liquid flow channel comprises a water channel groove extending from the lower end surface of the housing to an inside of the housing, welding a cover plate to the water channel groove, fixing the plug-in switch tube on the PCB board, fixing the PCB board to the housing, mounting an elastic pressing-piece into the housing through the fixed installation window on the housing, and pressing the plug-in switch tube against a side wall of the cooling liquid flow channel by the elastic pressing-piece, and mounting a bottom plate on the fixed installation window, and filling a joint between the fixed installation window and the bottom plate with a sealant.

8. The installation method according to claim 7, wherein a mounting base for mounting the elastic pressing-piece is provided on the side wall of said cooling liquid flow channel.

9. The installation method according to claim 8, wherein said elastic pressing-piece comprises a mounting portion that matches the mounting base, a vertical portion that is vertically arranged with the mounting base, and a clamping portion that is connected to the vertical portion and has an obtuse angle with the vertical portion.

\* \* \* \* \*